US006651877B2

(12) United States Patent
Fukuda et al.

(10) Patent No.: US 6,651,877 B2
(45) Date of Patent: Nov. 25, 2003

(54) MULTI-ROM WRITER AND CONTROL METHOD THEREOF

(75) Inventors: Ichiro Fukuda, Kawagoe (JP); Toshikazu Hisai, Sakado (JP); Shinichi Machida, Sakado (JP)

(73) Assignee: Kabushiki Kaisha Nippon Conlux, Tokyo (JP)

( * ) Notice: Subject to any disclaimer, the term of this patent is extended or adjusted under 35 U.S.C. 154(b) by 201 days.

(21) Appl. No.: 09/737,266

(22) Filed: Dec. 13, 2000

(65) Prior Publication Data

US 2001/0007534 A1 Jul. 12, 2001

(30) Foreign Application Priority Data

Dec. 22, 1999 (JP) ............................................. 11-365168
Dec. 22, 1999 (JP) ............................................. 11-365169
Dec. 22, 1999 (JP) ............................................. 11-365170

(51) Int. Cl.[7] ................................................ G06F 17/00
(52) U.S. Cl. ...................... 235/375; 235/380; 711/103
(58) Field of Search .................. 235/375, 381, 235/380, 486, 492; 714/719; 62/126; 710/72; 711/102, 103, 154

(56) References Cited

U.S. PATENT DOCUMENTS

| 3,969,618 A | 7/1976 | Stubel et al. ............... 714/719 |
| 4,417,450 A | 11/1983 | Morgan, Jr. et al. .......... 62/126 |
| 4,675,513 A | 6/1987 | Kuze ......................... 235/375 |
| 5,500,517 A | 3/1996 | Cagliostro .................. 235/486 |
| 5,687,345 A | 11/1997 | Matsubara et al. ......... 711/103 |
| 6,085,268 A | 7/2000 | Lee et al. ..................... 710/72 |
| 6,249,848 B1 * | 6/2001 | Terada et al. ............... 711/154 |
| 6,275,911 B1 * | 8/2001 | Terada et al. ............... 711/154 |
| 2001/0032289 A1 * | 10/2001 | Terada et al. ............... 711/103 |

FOREIGN PATENT DOCUMENTS

| GB | 2 324 624 | 10/1998 |
| GB | 2 351 377 | 12/2000 |
| JP | 01-93886 | 4/1989 |
| JP | 01-292556 | 11/1989 |
| JP | 03-248123 | 11/1991 |
| JP | 04-291489 | 10/1992 |
| JP | 05-233914 | 9/1993 |
| JP | 9-62910 A | 3/1997 |
| JP | 9-128605 A | 5/1997 |
| JP | 09-245218 | 9/1997 |
| JP | 10-134221 | 5/1998 |
| JP | 2001-188686 A | 7/2001 |
| WO | WO95/31796 | 11/1995 |
| WO | WO95/31797 | 11/1995 |

OTHER PUBLICATIONS

Universal EEPROM Programmer, IBM technical dislocure bulletin NN84056648, May 1, 1984.

* cited by examiner

*Primary Examiner*—Jared J Fureman
(74) *Attorney, Agent, or Firm*—Welsh & Katz, Ltd.

(57) ABSTRACT

A program and data corresponding to a flash memory which is to be the target of overwriting are read from a storage medium such as a PC card 2, and the flash memory is overwritten using a multi-read only memory (ROM) writer by executing the program which was read. The multi-ROM writer is capable of overwriting different types of flash memories.

20 Claims, 14 Drawing Sheets

```
FLASH ROM WRITE:1
COIN:2    VOLTAGE:3
```

FIG. 12(a)

```
FLASH ROM WRITE
START:STR/STOP:END
```

FIG. 12(b)

```
FLASH ROM WRITE
WRITING
```

FIG. 12(c)

```
FLASH ROM WRITE
NORMAL END                    >
```

FIG. 12(d)

```
FLASH ROM WRITE
WRITE ABNORMAL                >
```

FIG. 12(e)

```
COIN LEVEL ADJUSTMENT
START:STR/STOP:END
```

FIG. 13(a)

```
COIN LEVEL ADJUSTMENT
CANCL                                                >
```

FIG. 13(b)

```
10 YEN COIN INSERTED
              12 REMAINING
```

FIG. 13(c)

```
COIN LEVEL DATA
WRITING
```

FIG. 13(d)

```
COIN LEVEL ADJUSTMENT
NORMAL END                                           >
```

FIG. 13(e)

```
COIN LEVEL ADJUSTMENT
WRITE ABNORMAL                                       >
```

FIG. 13(f)

| S | T | N | D | B | Y |  | V | O | L | T | A | G | E |  | V | A | L | U | E |  |  |  |
|---|---|---|---|---|---|---|---|---|---|---|---|---|---|---|---|---|---|---|---|---|---|---|
| S | T | A | R | T | : | S | T | R | / | S | T | O | P | : | E | N | D |  |  |  |  |  |

FIG. 14 (a)

| V | O | L | T | A | G | E |  | V | A | L | U | E |  | D | I | S | P | L | A | Y |
|---|---|---|---|---|---|---|---|---|---|---|---|---|---|---|---|---|---|---|---|---|
| C | A | N | C | L |  |  |  |  |  |  |  |  |  |  |  |  |  |  |  | > |

FIG. 14 (b)

| C | A |  | x | . | x | x |  |  |  |  | C | B |  | x | . | x | x |  |  |
|---|---|---|---|---|---|---|---|---|---|---|---|---|---|---|---|---|---|---|---|
|   |   |   |   |   |   |   |   |   |   |   | C | C |  | x | . | x | x |  |  |

FIG. 14 (c)

MULTI-ROM WRITER AND CONTROL METHOD THEREOF

BACKGROUND OF THE INVENTION

1. Field of the Invention

The present invention relates to a multi-ROM writer and a control method thereof, and more particularly to a multi-ROM writer which can write information to various types of flash memories with a different interface, and a control method thereof.

2. Description of the Related Art

A microcomputer, which is built in to various equipment, conventionally operates by reading a program from a ROM (Read Only Memory) which is built in when the equipment is manufactured. Therefore, when a program to be used by the microcomputer is changed, the ROM must be changed, which makes changing a program difficult.

Recently, however, a program and data can be easily overwritten and changed by using an overwritable ROM, such as a flash memory.

An example of equipment where such an overwritable ROM as a flash memory is used is a controller of an automatic vending machine, a coin processing unit and a bill identification unit to be built in to an automatic vending machine, and in each one of this equipment, a program and data are overwritten and updated when necessary.

Each equipment of an automatic vending machine can output information internal to the equipment by serial communication, by which internal information is acquired and the coin evaluation level is adjusted. Coin evaluation level adjustment is an adjustment required when the output of each sensor to detect the features of a coin is changed due to the environment, and the output of each sensor is corrected or the threshold value is changed by inserting a genuine coin a plurality of times, and this adjustment result is also stored in the flash memory along with the program.

For flash memories, however, standards are not unified, and voltage to be applied when the stored content is overwritten, for example, is different depending on the product.

The interface to overwrite a flash memory may be different depending on the equipment where the flash memory is built in. So, in order to overwrite the stored content of a flash memory built in to the equipment, a dedicated ROM writer for the equipment must be used.

In this way, an equipment where a flash memory is built in requires a corresponding dedicated ROM writer. However, a flash memory built into an equipment is not always the same if the model number is different, even if the type is the same, therefore a plurality of ROM writers may have to be prepared, which is inconvenient.

For example, when one company owns a plurality of equipment, just like the case of an automatic vending machine, the company must visit the installation location of each automatic vending machine with a plurality of ROM writers corresponding to each automatic vending machine to overwrite a program of each automatic vending machine, which makes overwriting a program complicated.

SUMMARY OF THE INVENTION

With the foregoing in view, it is an object of the present invention to provide a multi-ROM writer which can overwrite the stored content of a plurality of types of flash ROM, and a control method thereof.

To achieve the above object, the invention is a multi-ROM writer which is selectively connected to various types of target equipment where each type of flash memory is mounted, and overwrites the flash memory mounted in the target equipment, comprising: a storage medium which stores an overwriting program corresponding to the flash memory of the target equipment and information to be written to the flash memory; reading means for reading the overwriting program and the information from the storage medium; and control means which operates using the overwriting program read by the reading means and overwrites the flash memory on the basis of the information read by the reading means, by controlling the transmission of data to the flash memory, the reception of data from the flash memory, and the output voltage switching which switches and outputs a voltage selected from a plurality of voltages.

The invention comprises a connection to the target equipment implemented by means of a cable which has a predetermined connector shape and pin layout corresponding to the target equipment selected from a plurality of types of cables.

The invention further comprises that the storage medium is a PC card.

The invention further comprises the information is a control program of the target equipment, and the control means writes the control program to the flash memory.

The invention comprises that information is setup information including operating conditions of the target equipment, and the control means writes the setup information to the flash memory.

The invention further comprising communication means for communicating with the target equipment, wherein the communication means acquires an operation status of the target equipment.

The invention further comprising the control means overwrites the flash memory on the basis of the operation status of the target equipment acquired by the communication means and the information read by the reading means.

The invention further comprising target equipment that includes at least one of a controller, a coin processing unit, a bill processing unit and a card processing unit which are installed in an automatic vending machine.

The invention further comprises target equipment is a coin processing unit which is installed in an automatic vending machine, and the control means acquires a coin identification level of the coin processing unit via the communication means, updates the identification level on the basis of the acquired identification level and of an identification result of a coin inserted into the coin processing unit, and writes the updated identification level to the flash memory.

The invention further comprising that target equipment is a bill processing unit which is installed in an automatic vending machine, and the control means acquires a bill identification level of the bill processing unit via the communication means, updates the identification level on the basis of the acquired identification level and of an identification result of a bill inserted into the bill processing unit, and writes the updated identification level to the flash memory.

The invention comprises a control method of a multi-ROM writer which is selectively connected to various types of target equipment where each type of flash memory is mounted and overwrites the flash memory mounted in the target equipment, wherein an overwriting program corresponding to the flash memory of the target equipment and information to be written to the flash memory are read from a storage medium, and the information is written to the flash memory using the overwriting program which was read, by controlling the transmission of data to the flash memory, the reception of data from the flash memory, and the output voltage switching which switches and outputs a voltage selected from a plurality of voltages.

The invention further comprises the connection to the target equipment is implemented by means of a cable which has a predetermined connector shape and pin layout corresponding to the target equipment selected from a plurality of types of cables.

The invention further comprises that the storage medium is a PC card.

The invention further comprises that the information is a control program of the target equipment and the control program is written to the flash memory.

The invention further comprises that the information is setup information including operating conditions of the target equipment, and the setup information is written to the flash memory.

The invention comprises that communication with the target equipment is performed, and an operation status of the target equipment is acquired by means of this communication.

The invention further comprises that the flash memory is overwritten on the basis of the operation status of the target equipment acquired by means of the communication, and on the basis of the information read from the storage medium.

The invention further comprising that the target equipment includes at least one of a controller, a coin processing unit, a bill processing unit, and a card processing unit which are installed in an automatic vending machine.

The invention comprising the target equipment is a coin processing unit which is installed in an automatic vending machine, and a coin identification level of the coin processing unit is acquired by means of the communication, the identification level is updated on the basis of the acquired identification level and of an identification result of a coin inserted into the coin processing unit, and the updated identification level is written to the flash memory.

The invention further comprises the target equipment is a bill processing unit which is installed in an automatic vending machine, and a bill identification level of the bill processing unit is acquired by mean of the communication, the identification level is updated on the basis of the acquired identification level and of an identification result of a bill inserted into the bill processing unit, and the updated identification level is written to the flash memory.

BRIEF DESCRIPTION OF THE DRAWINGS

FIGS. 8(a) to 8(f) are diagrams depicting display examples on the display part 11 during operation of the multi-ROM writer 1;

FIGS. 9(a) to 9(d) are diagrams depicting display examples on the display part 11 during operation of the multi-ROM writer 1;

FIGS. 12(a) to 12(e) are diagrams depicting display examples on the display part 11 during operation of the multi-ROM writer 1;

FIGS. 13(a) to 13(f) are diagrams depicting display examples on the display part 11 during operation of the multi-ROM 1; and FIGS. 14(a) to 14(c) are diagrams depicting display examples on the display part 11 during operation of the multi-ROM writer 1.

DESCRIPTION OF THE PREFERRED EMBODIMENTS

An embodiment of a multi-ROM writer according to the present invention and a control method thereof will now be described with reference to the accompanying drawings.

Figure 1:
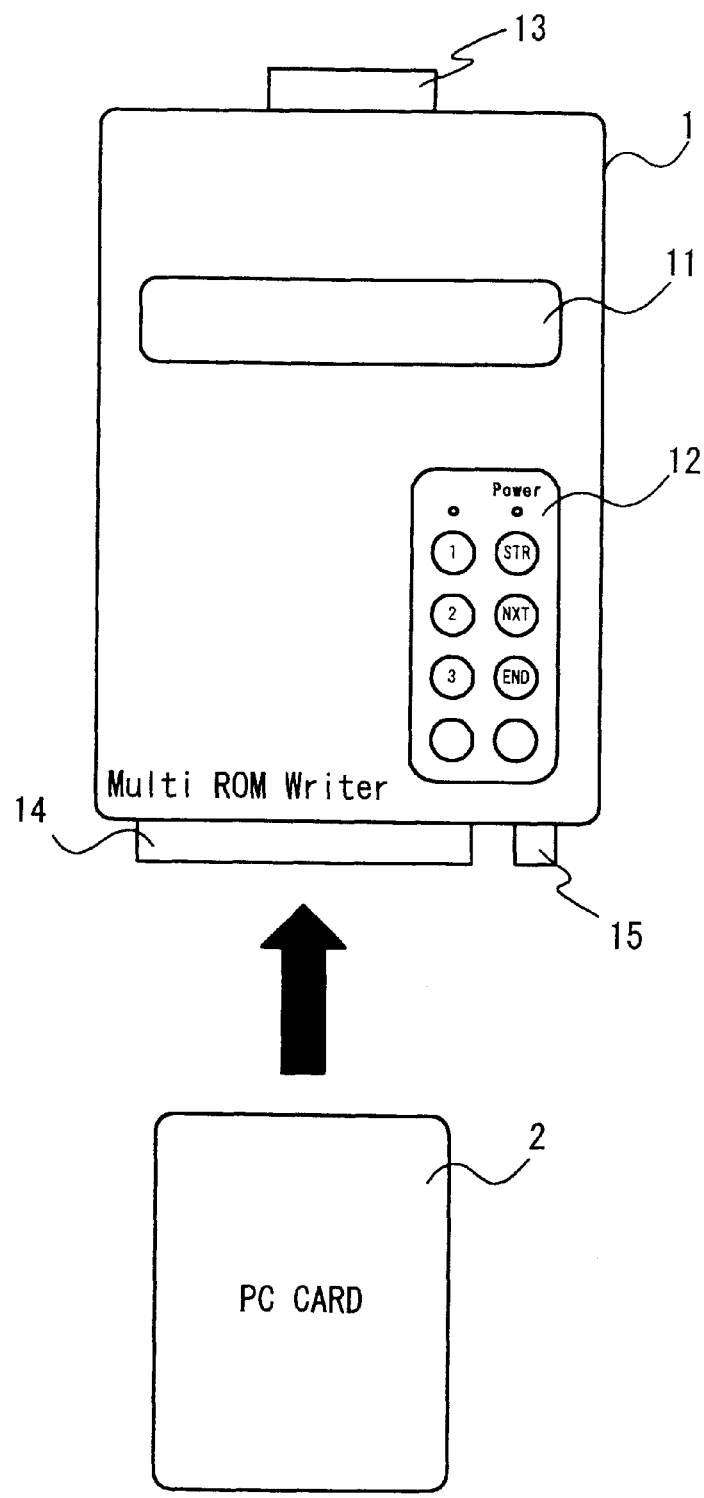
FIG. 1 is a diagram depicting an appearance of a multi-ROM writer according to the present invention.

FIG. 1 is a diagram depicting an appearance of the multi-ROM writer according to this invention.

As FIG. 1 shows, the multi-ROM writer 1 comprises a display part 11 to display a menu, operating instructions and error information, control keys 12 to input an operating instruction, a connector 13 for a cable to connect an equipment where a flash ROM to be overwritten is mounted, a PC card slot 14 to insert a PC card 2 where a program is stored, and an eject button 15 to eject the PC card 2.

Figure 2:
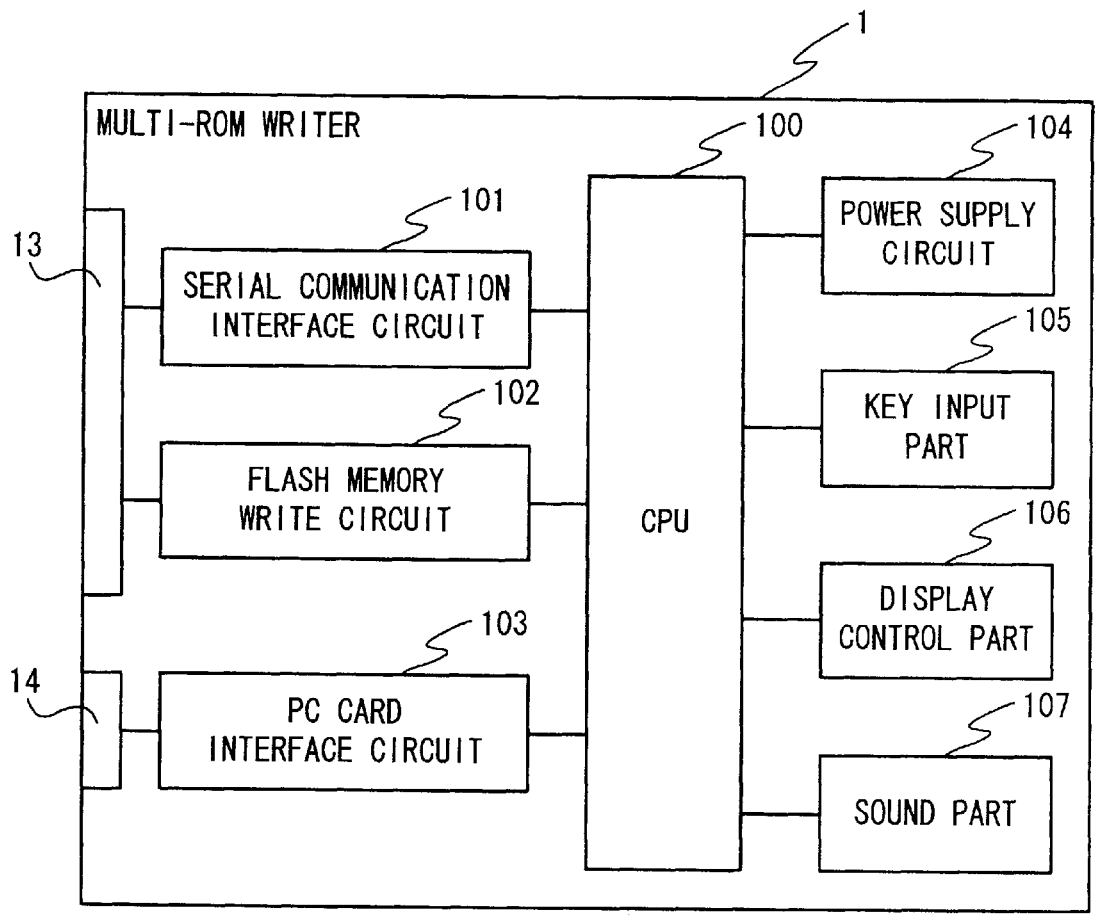
FIG. 2 is a block diagram depicting the configuration of the multi-ROM writer 1.

FIG. 2 is a block diagram depicting the configuration of the multi-ROM writer 1.

The multi-ROM writer 1 comprises a CPU 100, a serial communication interface circuit 101, a flash memory write circuit 102, a PC card interface circuit 103, a power supply circuit 104, a key input part 105, a display control part 106 and a sound part 107.

In this multi-ROM writer 1, the CPU 100 operates on the basis of the program stored in the PC card 2 inserted into the PC card slot 14. This program is read from the PC card 2 via the PC card interface circuit 103. In the PC card 2, not only the program to operate the multi-ROM writer 1, but also the data and program to be written to the flash memory mounted in the target equipment are stored.

The target equipment is an equipment where the flash memory is mounted, such as a register and a portable terminal used at a store, and various units used inside the automatic vending machine, including a main controller, a coin processing unit, a bill processing unit, and a card processing unit.

The connection to the target equipment is made by means of a cable via the connector 13, and signals transferred via this cable are processed by the serial communication interface circuit 101 and the flash memory write circuit 102. The power to operate the multi-ROM writer 1 and a predetermined voltage to write the flash memory are supplied by the power supply circuit 104.

To operate the multi-ROM writer 1, the key input part 105 receives the operation of the control keys 12 by the user, and the menu and information, such as responses to key operation, are displayed on the display part 11 via the display control part 106. The sound part 107 outputs a response tone at a key operation and an alarm tone at an error operation.

Now the serial communication interface circuit 101 will be described.

The serial communication interface circuit 101 is a circuit for performing serial communication between the multi-ROM writer 1 and the target equipment, and this serial communication interface circuit 101 allows the exchange of various information between the multi-ROM writer 1 and the target equipment.

Figure 3:
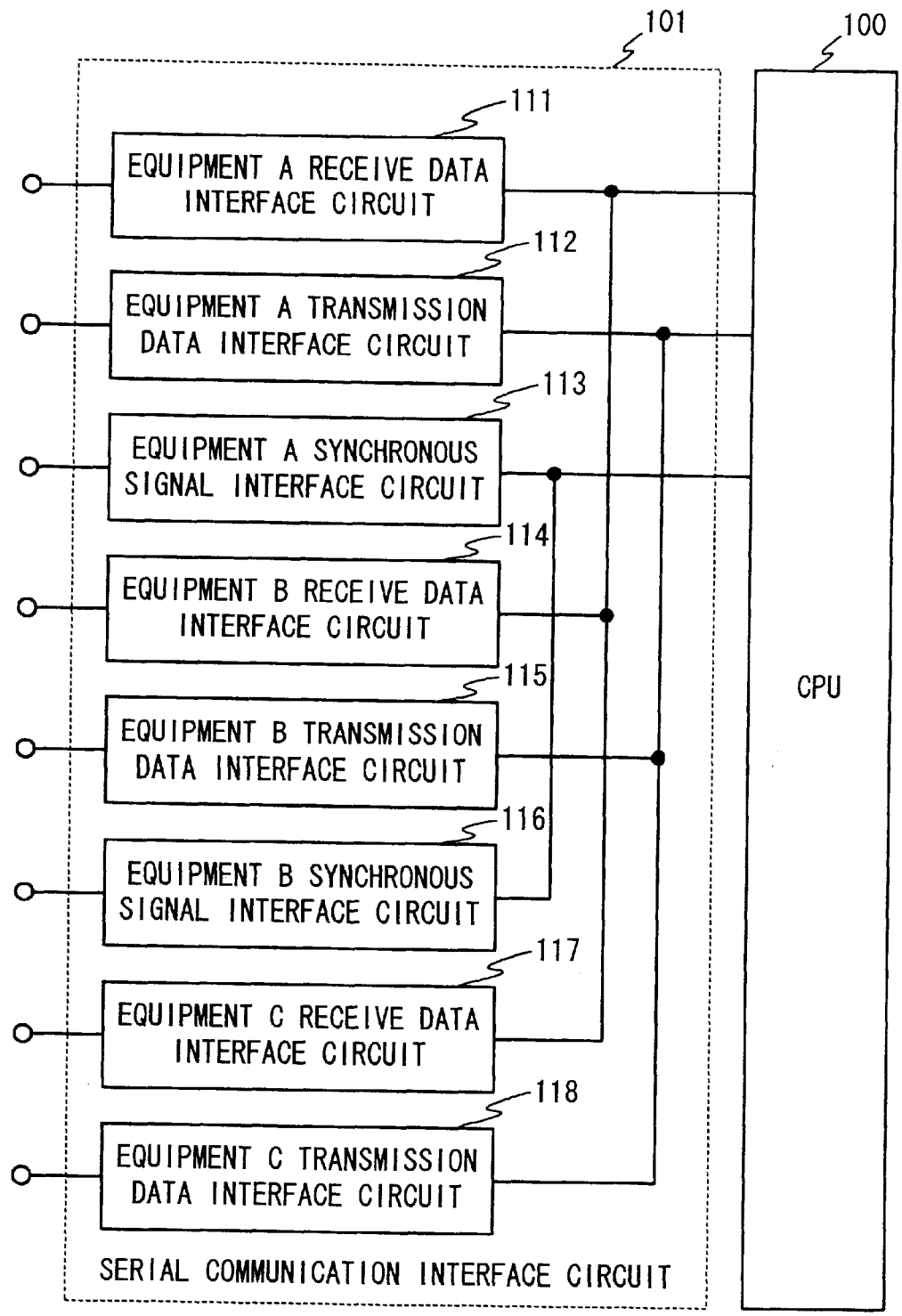
FIG. 3 is a block diagram depicting the configuration of a serial communication interface circuit 101.

FIG. 3 is a block diagram depicting the configuration of the serial communication interface circuit 101.

As FIG. 3 shows, the serial communication interface circuit 101 is comprised of an equipment A receive data interface circuit 111, an equipment A transmission data interface circuit 112, an equipment A synchronous signal interface circuit 113, an equipment B receive data interface circuit 114, an equipment B transmission data interface circuit 115, an equipment B synchronous signal interface circuit 116, an equipment C receive data interface circuit 117, and an equipment C transmission data interface circuit 118.

This serial communication interface circuit 101 performs serial communication with the equipment A (one type of target equipment) by the equipment A receive data interface circuit 111, the equipment A transmission data interface 112 and the equipment A synchronous signal interface circuit 113, and performs serial communication with the equipment B (a target equipment which is different from the equipment A) by the equipment B receive data interface circuit 114, the equipment B transmission data interface circuit 115 and the equipment B synchronous signal interface circuit 116. In the case of serial communication with the equipment C (a target equipment which is different from the equipment A and equipment B, and which does not require synchronous signals for serial communication), serial communication is enabled by the equipment C receive data interface circuit 117 and the equipment C transmission data interface circuit 118, since synchronous signals are not required.

The serial communication interface circuit 101 is connected to the target equipment by means of a cable via a connector 13, and the cable required for this connection may be different depending on the target equipment (described later).

Now the flash memory write circuit 102 will be described.

The flash memory write circuit 102 is a circuit for writing to the flash memory mounted on the target equipment.

Figure 4:
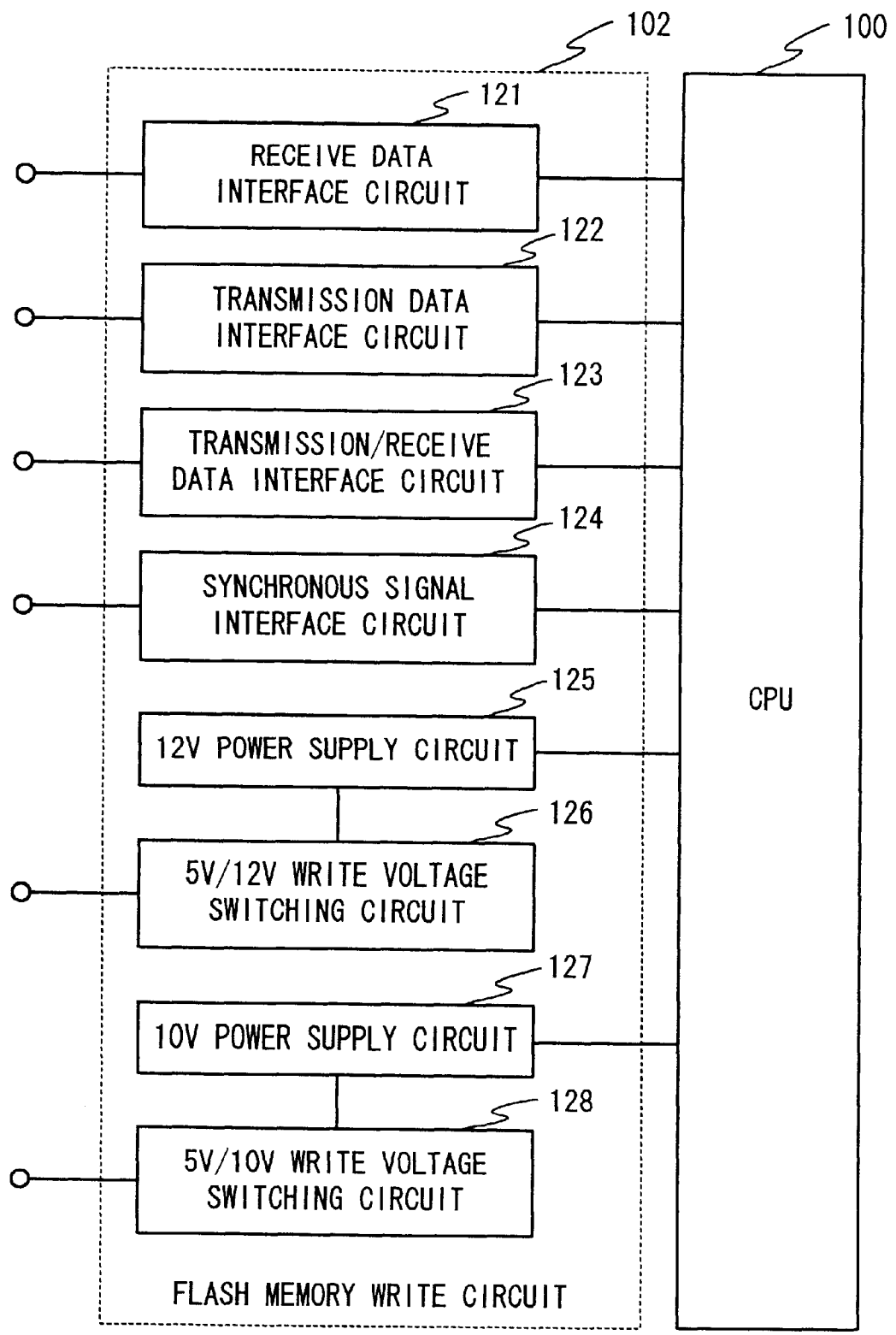
FIG. 4 is a block diagram depicting the configuration of a flash memory write circuit 102.

FIG. 4 is a block diagram depicting the configuration of the flash memory write circuit 102.

As FIG. 4 shows, the flash memory write circuit 102 is comprised of a receive data interface circuit 121, a transmission data interface circuit 122, a transmission/receive data interface circuit 123, a synchronous signal interface circuit 124, a 12V power supply circuit 125, a 5V/12V write voltage switching circuit 126, a 10V power supply circuit 127 and a 5V/10V write voltage switching circuit 128.

The receive data interface circuit 121 and the transmission data interface circuit 122 are circuits for a target equipment, mounting a type of flash memory which transmits/receives the transmission data and receive data by different signal lines, and the transmission/receive data interface circuit 123 is a circuit for a target equipment, mounting a type of flash memory which transmits/receives the transmission data and receive data by the same signal line. The synchronous signal interface circuit 124 is a circuit for a target equipment, mounting a type of a flash memory, which requires a synchronous signal when a signal is transmitted/received.

The 12V power supply circuit 125 is a circuit for generating a 12V voltage, and the 5V/12V write voltage switching circuit 126 is a circuit for outputting the 12V voltage when the 12V power supply circuit 125 is operating and generating a 12V voltage, and outputting a 5V power supply which is supplied from the power supply circuit 104 when the 12V power supply circuit 125 is not operating.

The 10V power supply circuit 127 is a circuit for generating a 10V voltage, and the 5V/10V write voltage switching circuit 128 is a circuit for outputting the 10V voltage when the 10V power supply circuit 128 is operating and generating a 10V voltage, and outputting a 5V power supply which is supplied from the power supply circuit 104 when the 10V power supply circuit 127 is not operating.

This flash memory write circuit 102 as well is connected to the target equipment by means of a cable via the connector 13, in the same way as the serial communication interface circuit 101, and the cable required for this connection may be different depending on the target equipment (described later).

Now the connection between the multi-ROM writer 1 and the target equipment will be described.

Figure 5A:
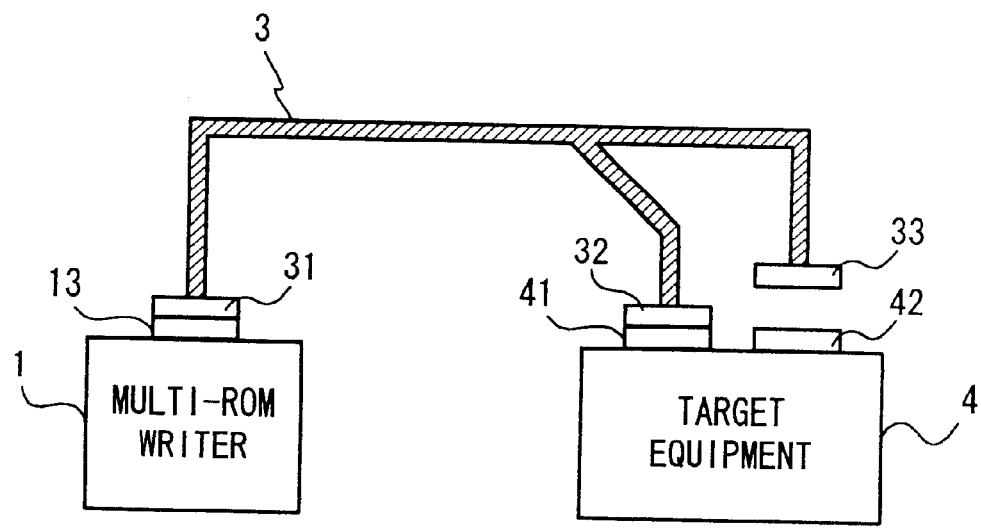
FIG. 5(a) is a diagram depicting a connection example of the multi-ROM writer 1 and the target equipment 4 when serial communication is performed between the multi-ROM writer 1 and the target equipment 4.
Figure 5B:
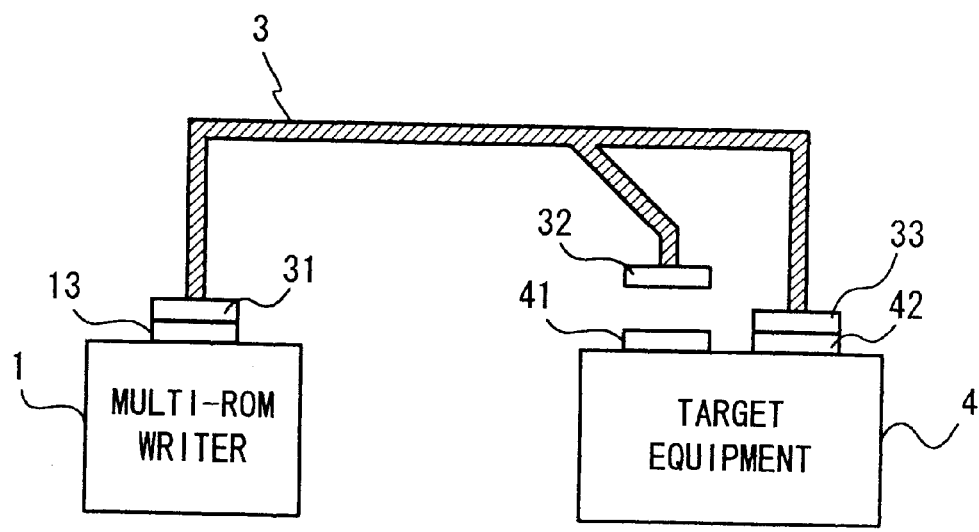
FIG. 5(b) is a diagram depicting a connection example of the multi-ROM writer 1 and the target equipment 4 when the flash memory of the target equipment 4 is written.

FIG. 5(*a*) and FIG. 5(*b*) are diagrams depicting a connection example between the multi-ROM writer 1 and a target equipment.

As these figures show, the target equipment 4 is comprised of a connector 41 for serial communication and a connector 42 for writing flash memory, and the multi-ROM writer 1 and the target equipment 4 are connected by connecting the connector 31 of the cable 3, which connects the multi-ROM writer 1 and the target equipment 4, and the connector 13, and connecting the connector 32 and the connector 41, or the connector 33 and the connector 42.

To perform serial communication between the multi-ROM writer 1 and the target equipment 4, the connector 32 and the connector 41 are connected, and the connector 33 and the connector 42 are not connected, as FIG. 5(*a*) shows. When the connector 32 and the connector 41 are connected, the serial communication interface circuit 102 of the multi-ROM writer 1 and the serial communication interface circuit, which is not illustrated, of the target equipment 4 are connected.

To write to the flash memory of the target equipment 4, the connector 33 and the connector 42 are connected and the connector 32 and the connector 41 are not connected, as FIG. 5(*b*) shows. When the connector 33 and the connector 42 are connected, the flash memory write circuit 102 of the multi-ROM writer 1 and the flash memory write circuit, which is not illustrated, of the target equipment 4 are connected.

Now the cable 3 for connecting the multi-ROM writer 1 and the target equipment 4 will be described.

Since there are various types of target equipment 4, the shapes of the connectors 41 and 42 are not always the same. Also, even if the connector shape is the same, the pin layout is not always the same, so a dedicated cable 3 must be prepared for each type of the target equipment 4. Therefore, the cable 3 not only connects the multi-ROM writer 1 and the target equipment 4, but also cancels out the difference of the connector shape and the difference of the pin layout.

Figure 6A:
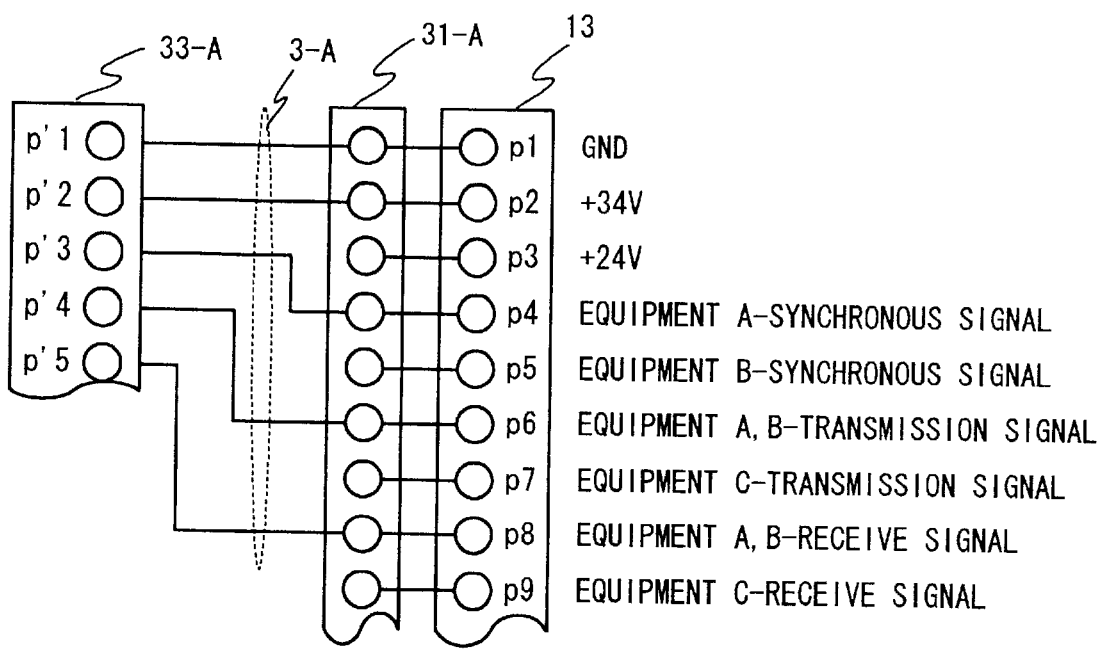
FIG. 6(a) is a diagram depicting a configuration example of a cable 3.
Figure 6B:
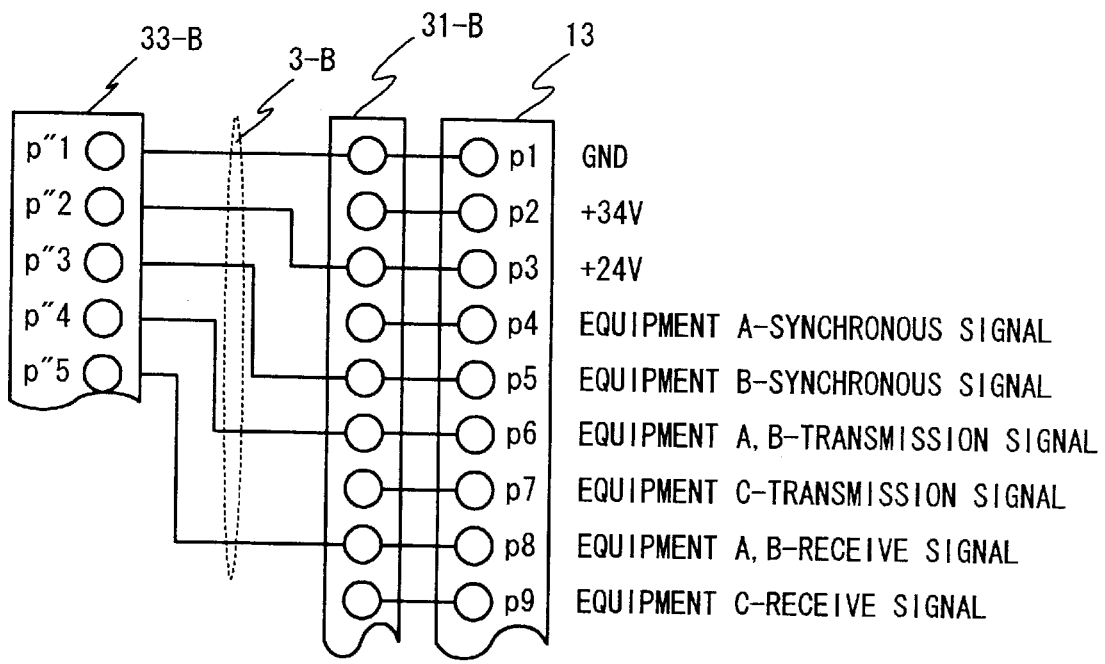
FIG. 6(b) is a diagram depicting another configuration example of the cable 3.

FIG. 6(a) and FIG. 6(b) are diagrams depicting a configuration example of the cable 3.

Here, it is assumed that the pin layout is GND, +34V, +24V, equipment A-synchronous signal, equipment B-synchronous signal, equipment A, B-transmission signal, equipment C-transmission signal, equipment A, B-receive signal and equipment C-receive signal, sequentially from p1.

In the cable 3-A for the equipment A (one type of the target equipment 4), in this case, wiring with the connector 31-A is configured such that the pin layout of the connector 32-A at the equipment side becomes GND, +34V, equipment A-synchronous signal, equipment A, B-transmission signal, and equipment A, B-receive signal, sequentially from p'1, as FIG. 6(a) shows.

In the cable 3-B for the equipment B, wiring with the connector 31-B is configured such that the pin layout of the connector 32-B at the equipment side becomes GND, +24V, equipment B-synchronous signal, equipment A, B-transmission signal, and equipment A, B-receive signal, sequentially from p"1, as FIG. 6(b) shows.

In FIG. 6(a) and FIG. 6(b), only the portion of the cable 3 which transmits signals required for the serial communication is shown, but the portion required for writing the flash memory has the same configuration. In this case, however, wiring is created between the connector 31 and the connector 33.

Now, the operation of the multi-ROM writer 1 will be described with reference to FIG. 7 to FIGS. 9(a) to 9(d).

Figure 7:
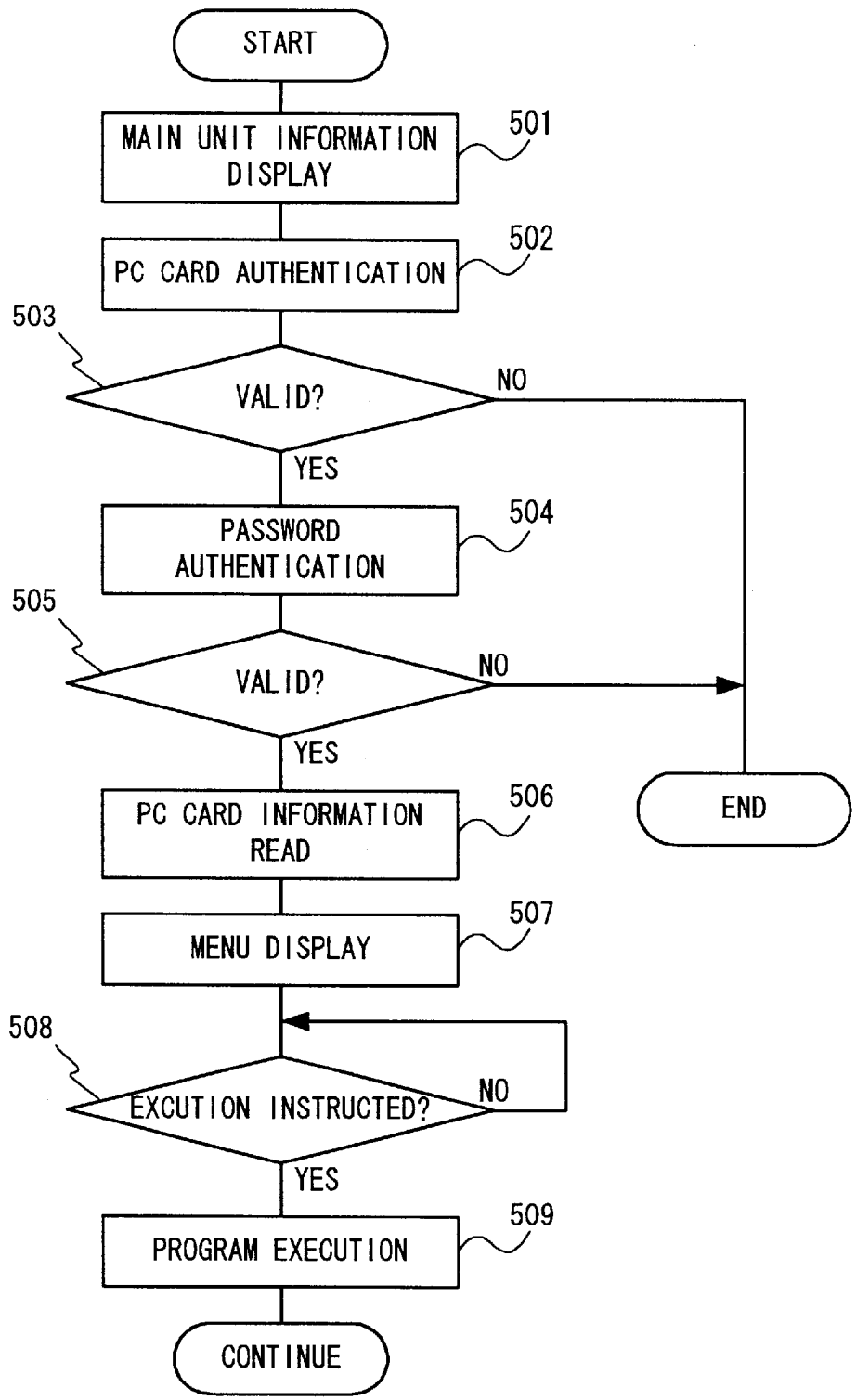
FIG. 7 is a flow chart depicting an operation flow of the multi-ROM writer 1.

FIG. 7 is a flow chart depicting the operation flow of the multi-ROM writer 1, and FIGS. 8(a) to 8(f) and FIGS. 9(a) to 9(d) show display examples of the display part 11 during operation of the multi-ROM writer 1.

The multi-ROM writer 1 starts operation when power is turned ON, and displays the main unit information shown in FIG. 8(a) in the display part 11 (Step 501). Then the multi-ROM writer 1 authenticates the PC card 2 inserted into the PC card slot 14 (Step 502). At this time, a message indicating that the PC card 2 is being authenticated, as shown in FIG. 8(b), is displayed on the display part 11.

If the PC card 2 is not inserted into the PC card slot 14, or if the inserted card is not a valid one which is not adopted to the multi-ROM writer 1 at this time, then the authentication is NG (NO in Step 503), a message indicating NG, as shown in FIG. 8(c) is displayed on the display part, and processing ends.

If the PC card 2 inserted into the PC card slot 14 is valid, then authentication is OK (YES in Step 503), the display part 11 displays a message indicating OK, as shown in FIG. 8(d), and the display part prompts the user to input a password by displaying a password input instruction, as shown in FIG. 8(e). When a password is input by the control keys 12, the input password is displayed by "*" on the display part 11, as shown in FIG. 8(f).

When a password is input, the multi-ROM writer 1 authenticates the password (Step 504). If the input password is invalid as a result of authentication (NO in Step 505), processing ends. Since the display part 11 displays the same status as FIG. 8(f) at this time, the power of the multi-ROM writer 1 is shut OFF first, is turned ON again, and processing is restarted from Step 501 to input a password again.

If the input password is valid as the result of the authentication, the CPU 100 reads information on the program stored in the PC card 2 (Step 506), and displays the menu shown in FIG. 9(a) on the display part 11 (Step 507). The menu is displayed according to the result of executing the menu program stored in the PC card 2.

When the multi-ROM writer 1 displays a menu on the display part 11, the multi-ROM writer 1 waits for an instruction to execute the program by the control keys 12 (NO in Step 508), and when execution of the program is instructed (YES in Step 508), the multi-ROM writer 1 executes the instructed program (Step 509), and thereafter the multi-ROM writer 1 operates according to the executed program.

When the program is executed, if for example writing to flash memory is instructed in the state where the menu shown in FIG. 9(a) is displayed on the display part 11, then the multi-ROM writer 1 starts writing to the flash memory mounted in the target equipment 4. When writing to flash memory starts, a message indicating that writing is being executed, as shown in FIG. 9(b), is displayed on the display part 11.

If writing to flash memory ends normally, a message indicating that writing ended normally, as shown in FIG. 9(c), is displayed on the display part 11, and if writing to flash memory fails, a message indicating that writing failed, as shown in FIG. 9(d), is displayed on the display part.

Now using a coin processing unit to be installed in an automatic vending machine as a specific example of the target equipment, processing for the coin processing unit by the multi-ROM writer 1 will be described. Here, the coin processing unit is described as the target equipment, but if the target is an automatic vending machine, all equipment mounting a flash memory, such as a bill processing unit, a card processing unit for handling electronic money, and the main controller of the automatic vending machine itself are the target equipment.

The coin processing unit is installed inside the automatic vending machine, performs serial communication with the automatic vending machine controller which controls this automatic vending machine, and receives inserted coins or outputs change.

Figure 10:
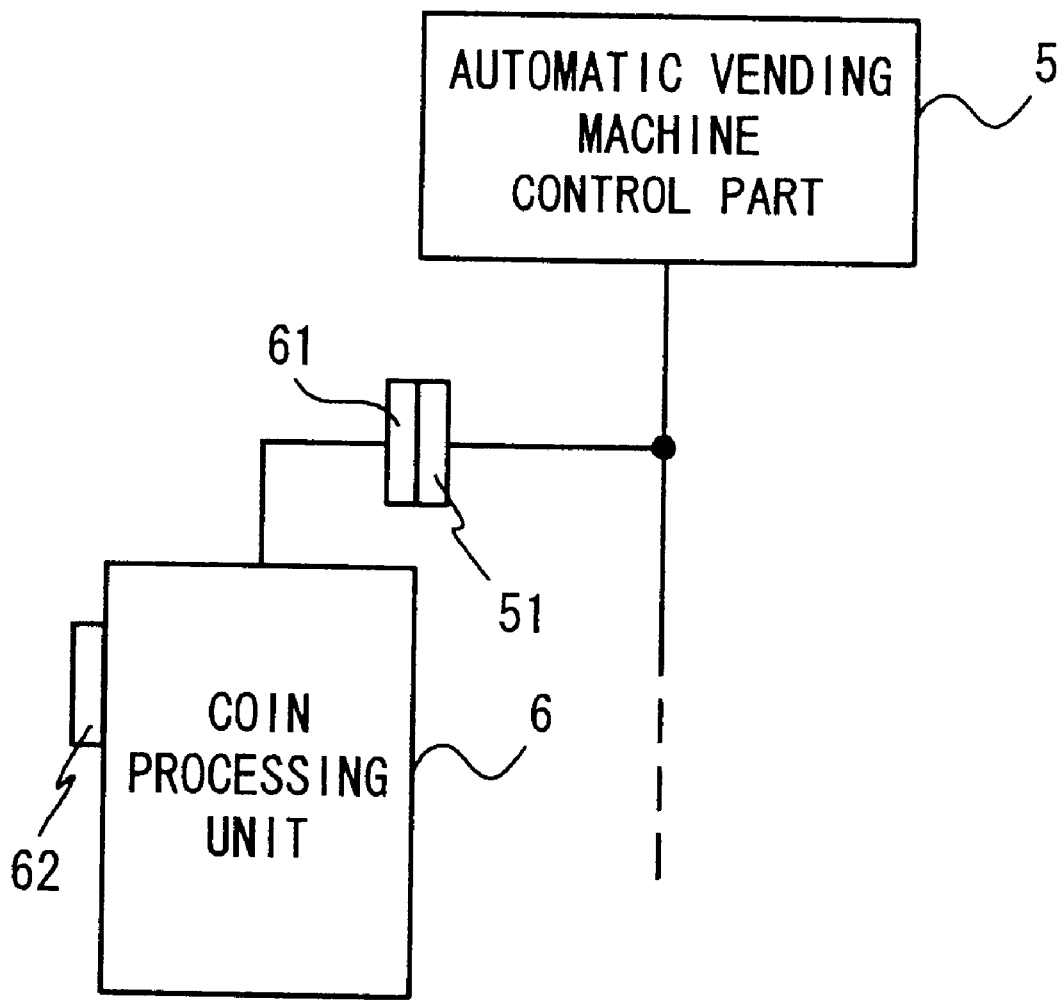
FIG. 10 is a diagram depicting a connection example of a coin processing unit 7 inside an automatic vending machine.

FIG. 10 is a diagram depicting a connection example of the coin processing unit in the automatic vending machine.

As FIG. 10 shows, the automatic vending machine controller 5, to control the automatic vending machine in general, and the coin processing unit 6 are installed in the automatic vending machine, and the automatic vending machine controller 5 and the coin processing unit 6 are connected by the connector 51 and the connector 61, and perform serial communication with each other. The coin processing unit 6 has a flash memory, which is not illustrated, and the connector 62 is used for overwriting the program and data stored in this flash memory.

A program for operating the coin processing unit and data on identification levels to identify the type of inserted coin and genuineness are stored in the flash memory of the coin processing unit 6.

The stored content of the flash memory of the coin processing unit 6 is overwritten by the multi-ROM writer 1, and a connection example between the multi-ROM writer 1 and the coin processing unit 6 at this time will now be described with reference to FIG. 11(a) and FIG. 11(b).

Figure 11A:
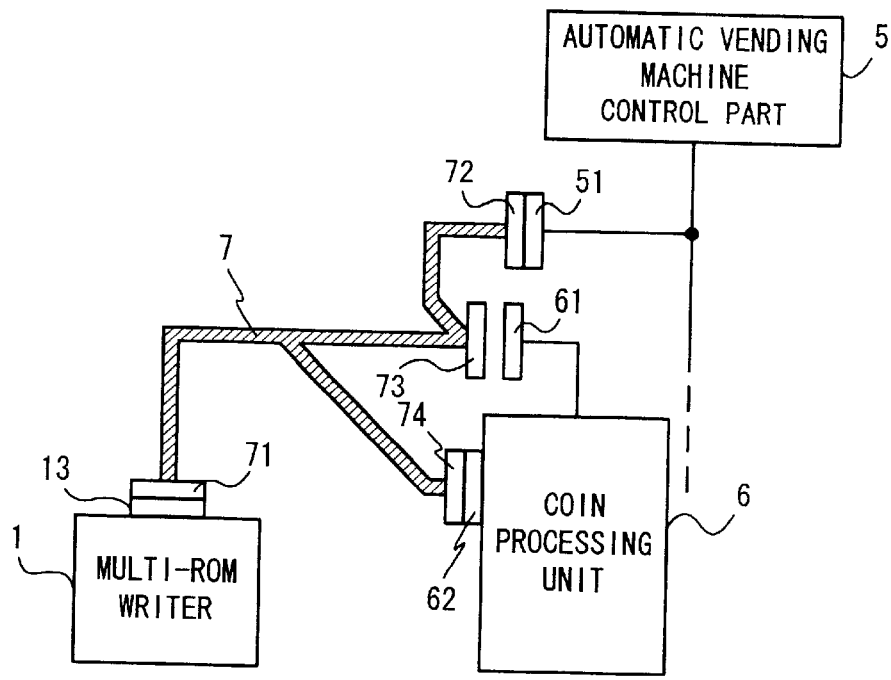
FIG. 11(a) is a diagram depicting a connection example of the multi-ROM writer 1 and the coin processing unit 7 when the flash memory of the coin processing unit 7 is written.

To overwrite the program which is stored in the content of the flash memory of the coin processing unit 6, the connector 71 of the cable 7 and the connector 13 of the multi-ROM writer 1 are connected, the connector 72 and the connector 51 are connected, and the connector 74 and the connector 62 are connected, as shown in FIG. 11(a). Since the connector 73 of the cable 7 is a connector to be used for serial communication between the multi-ROM writer 1 and the coin processing unit 6, the connector 73 is not always necessary.

The connector 13 is a connector to connect both the serial communication interface circuit 101 and the flash memory write circuit 102 with the cable 7, as mentioned above, and the cable 7 is structured such that the connector 72 and the connector 73 are connected to the serial communication interface circuit 101, and the connector 74 is connected to the flash memory write circuit 102. The configuration of the cable 7 is the same as the above mentioned configuration of the cable 3.

Figure 11B:
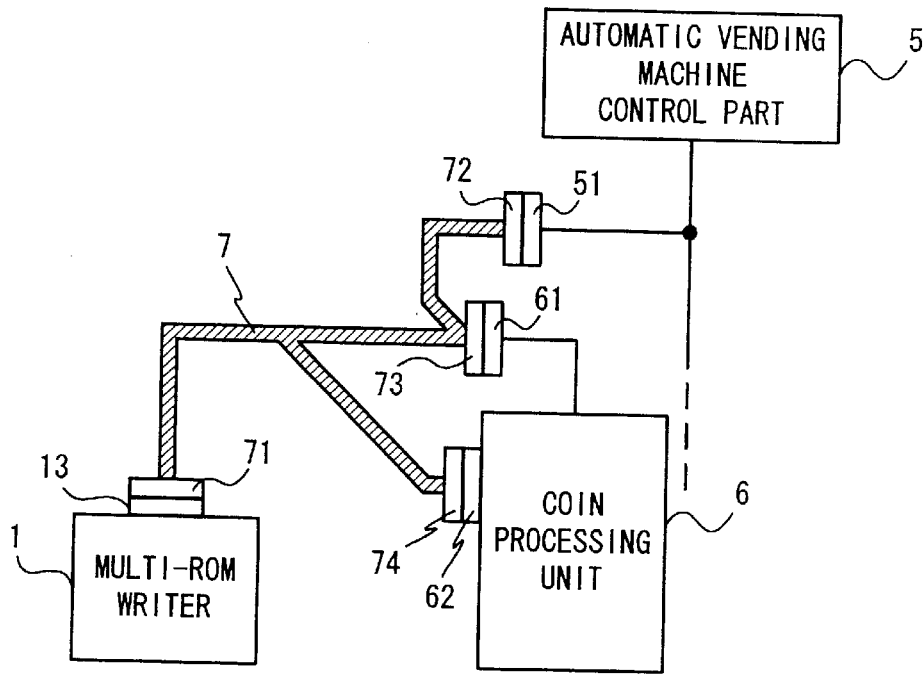
FIG. 11(b) is a diagram depicting a connection example of the multi-ROM writer 1 and the coin processing unit 7 when serial communication is performed between the multi-ROM writer 1 and the coin processing unit 7.

When the data which is stored in the content of the flash memory of the coin processing unit 6 is overwritten, the connector 71 of the cable 7 and the connector 13 of the multi-ROM writer 1 are connected, and the connector 72 and the connector 51, the connector 73 and the connector 61 and the connector 74 and the connector 62 are connected respectively, as shown in FIG. 11(b).

Now the overwriting program and data of the coin processing unit 6 by the multi-ROM writer 1 will be described with reference to FIGS. 12(a) to 12(e) to FIGS. 14(a) to 14(c).

FIGS. 12(a) to 12(e) to FIGS. 14(a) to 14(c) are diagrams depicting examples of the screens displayed on the display part 11 of the multi-ROM writer 1 at overwriting processing of the program and data.

To overwrite the program and data of the coin processing unit 6, the multi-ROM writer 1 and the coin processing unit 6 are connected, as shown in FIG. 11(a) or FIG. 11(b), according to the processing to be executed. Then the PC card 2 corresponding to the coin processing unit 6 is inserted to the multi-ROM writer 1, and the power of the multi-ROM writer 1 is turned ON. When the power of the multi-ROM writer 1 is turned ON, the program corresponding to the coin processing unit 6 is executed according to the procedure which was described above with reference to FIG. 7.

When this program is executed, the menu shown in FIG. 12(a) is displayed on the display part 11. If writing the flash memory is instructed to overwrite the program of the coin processing unit 6 in this status, the multi-ROM writer 1 executes the program for writing the flash memory, and displays a message prompting to instruct execution of writing, as shown in FIG. 12(b), on the display part 11. In this case, the multi-ROM writer 1 and the coin processing unit 6 are connected, as shown in FIG. 11(a).

When the start of writing the flash memory is instructed in this status, the multi-ROM writer 1 starts writing to the flash memory mounted in the coin processing unit 6. When writing the flash memory starts, a message indicating writing, as shown in FIG. 12(c), is displayed on the display part 11.

If writing the flash memory ends normally, a message indicating that writing ended normally, as shown in FIG. 12(d), is displayed on the display part 11, and if writing the flash memory fails, a message indicating that writing failed, as shown in FIG. 12(e), is displayed on the display part 11.

If a coin (adjustment of coin evaluation field) is selected in the state where the menu shown in FIG. 12(a) is displayed on the display part 11, the multi-ROM writer 1 executes the program for adjusting the coin evaluation level. To execute this processing, the multi-ROM writer 1 and the coin processing unit 6 are connected, as shown in FIG. 11(b).

Adjustment of the coin evaluation level is executed when the output of each sensor (not illustrated) to detect the features of a coin is changed by the environment, when the output of each sensor is corrected, or when the threshold value is changed by inserting a genuine coin for a plurality of times.

When a program for adjusting the coin evaluation level is executed, the multi-ROM writer 1 starts adjustment processing, and displays a message prompting to instruct the start of adjustment processing, as shown in FIG. 13(a), on the display part 11. If the start of adjustment processing is instructed in this status, the multi-ROM writer 1 starts adjustment processing. When the adjustment processing starts, a message to indicate that adjustment processing is progressing, as shown in FIG. 13(b), is displayed on the display part 11, and when a coin is inserted into the coin processing unit 5, the type of coin and the number of remaining coins to be inserted (the remainder of the number of times of insertions required for level adjustment), as shown in FIG. 13(c), are displayed on the display part 11.

When the number of inserted coins (the number of times of insertion) reaches a predetermined value, the multi-ROM writer 1 writes the adjustment result to the flash memory, and the message, shown in FIG. 13(d), is displayed on the display part 11 at this time.

If writing the flash memory ends normally, a message to indicate that the adjustment ended normally, as shown in FIG. 13(e), is displayed on the display part 11, and if writing the flash memory fails, a message to indicate that the adjustment failed, as shown in FIG. 13(f), is displayed on the display part 11.

The multi-ROM writer 1 can perform processing which does not involve writing the flash memory, such as measuring and displaying the internal voltage of the coin processing unit 6, and in such a case, the connector 73 and the connector 61 are connected, and the connector 74 and the connector 62 are not connected.

To measure and display the internal voltage of the coin processing unit 6, "voltage" (display of internal voltage) is selected when the menu shown in FIG. 12(a) is displayed on the display part 11, and the multi-ROM writer 1 executes the program to display the internal voltage by this selection.

When the program to display the internal voltage is executed, the multi-ROM writer 1 starts display processing, and displays a message prompting to instruct the start of display processing, as shown in FIG. 14(a), on the display part 11. If the start of display processing is instructed in this status, the multi-ROM writer 1 starts display processing. When the display processing starts, a message to indicate that display processing is progressing, as shown in FIG. 14(b), is displayed on the display part 11, and when the internal voltage of the coin processing unit 6 is acquired, the voltage is displayed on the display part 11, as shown in FIG. 14(c).

In the above description, the type of the target equipment (e.g. coin processing unit 5) connected to the multi-ROM writer 1 is not checked, but the type of the target equipment can be easily checked before executing the program by changing the program.

In the above description, only the coin processing unit is described as the target equipment which uses the multi- ROM writer 1, but various other equipment can be used as the target equipment. When an automatic vending machine is the target, a bill processing unit, a card processing unit which handles electronic money, and the main controller of the automatic vending machine itself can be the target equipment, where various adjustments and functional changes can be made, including adjusting the genuineness judgment level of a bill, adding a new type to be accepted, supporting a change of format of a card, and adding a lottery function for promotions.

INDUSTRIAL APPLICABILITY

This invention is a multi-ROM writer which reads a program and data corresponding to the flash memory to be overwritten from such a storage medium as a PC card, and overwrites the flash memory by executing the read program, and the control method thereof. According to this configuration, different types of flash memory can be easily overwritten.

What is claimed is:

1. A multi-read only memory (ROM) writer which is selectively connected to various types of target equipment where each type of flash memory having different overwriting voltage requirements is mounted, and overwrites the flash memory mounted in the target equipment, comprising:

a storage medium which stores an overwriting program corresponding to the flash memory of the target equipment and information to be written to the flash memory;

reading means for reading the overwriting program and the information from the storage medium;

control means which operates using the overwriting program read by the reading means and overwrites the flash memory on the basis of the information read by the reading means, by controlling the transmission of data to the flash memory, the reception of data from the flash memory, and an output voltage switching means which switches and outputs a voltage selected from a plurality of voltages according to the overwriting voltage requirements of the type of flash memory; and power supply means for acquiring a power from a main control unit corresponding to the target equipment and supplying the acquired power to the target equipment, the reading means and the control means.

2. The multi-ROM writer according to claim 1, wherein a connection to the target equipment and the main control unit is implemented by means of a cable which has a predetermined connector shape and pin layout corresponding to the target equipment and the main control unit selected from a plurality of types of cables.

3. The multi-ROM writer according to claim 1, wherein the storage medium is a personal computer (PC) card.

4. The multi-ROM writer according to claim 1, wherein the information is a control program of the target equipment, and the control means writes the control program to the flash memory.

5. The multi-ROM writer according to claim 1, wherein the information is setup information including operating conditions of the target equipment, and the control means writes the setup information to the flash memory.

6. The multi-ROM writer according to claim 1, further comprising communication means for communicating with the target equipment, wherein the communication means acquires an operation status of the target equipment.

7. The multi-ROM writer according to claim 6, wherein the control means overwrites the flash memory on the basis of the operation status of the target equipment acquired by the communication means and the information read by the reading means.

8. The multi-ROM writer according to claim 6, wherein the target equipment is a coin processing unit which is installed in an automatic vending machine, and the control means acquires a coin identification level of the coin processing unit via the communication means, updates the coin identification level on the basis of the acquired coin identification level and of an identification result of a coin inserted into the coin processing unit, and writes the updated coin identification level to the flash memory.

9. The multi-ROM writer according to claim 6, wherein the target equipment is a bill processing unit which is installed in an automatic vending machine, and the control means acquires a bill identification level of the bill processing unit via the communication means, updates the bill identification level on the basis of the acquired bill identification level and of an identification result of a bill inserted into the bill processing unit, and writes the updated bill identification level to the flash memory.

10. The multi-ROM writer according to claim 1, wherein the target equipment includes at least one of a controller, a coin processing unit, a bill processing unit and a card processing unit which are installed in an automatic vending machine.

11. A control method of a multi-read only memory (ROM) writer which is selectively connected to various types of target equipment where each type of flash memory having different overwriting voltage requirements is mounted and overwrites the flash memory mounted in the target equipment, wherein a power is acquired from a main control unit corresponding to the target equipment and supplied to the target equipment, an overwriting program corresponding to the flash memory of the target equipment and information to be written to the flash memory are read from a storage medium, and the information is written to the flash memory using the overwriting program which was read, by controlling the transmission of data to the flash memory, the reception of data from the flash memory, and an output voltage switching means which switches and outputs a voltage selected from a plurality of voltages according to the overwriting voltage requirements of the type of flash memory.

12. The control method of the multi-ROM writer according to claim 11, wherein a connection to the target equipment is implemented by means of a cable which has a predetermined connector shape and pin layout corresponding to the target equipment and the main control unit selected from a plurality of types of cables.

13. The control method of the multi-ROM writer according to claim 11, wherein the storage medium is a personal computer (PC) card.

14. The control method of the multi-ROM writer according to claim 11, wherein the information is a control program of the target equipment and the control program is written to the flash memory.

15. The control method of the multi-ROM writer according to claim 11, wherein the information is setup information including operating conditions of the target equipment, and the setup information is written to the flash memory.

16. The control method of the multi-ROM writer according to claim 11, wherein communication with the target equipment is performed, and an operation status of the target equipment is acquired by means of this communication.

17. The control method of the multi-ROM writer according to claim 16, wherein the flash memory is overwritten on the basis of the operation status of the target equipment acquired by means of the communication, and on the basis of the information read from the storage medium.

18. The control method of the multi-ROM writer according to claim 16, wherein the target equipment is a coin processing unit which is installed in an automatic vending machine, and a coin identification level of the coin processing unit is acquired by means of the communication, the coin identification level is updated on the basis of the acquired coin identification level and of an identification result of a coin inserted into the coin processing unit, and the updated coin identification level is written to the flash memory.

19. The control method of the multi-ROM writer according to claim 16, wherein the target equipment is a bill processing unit which is installed in an automatic vending machine, and a bill identification level of the bill processing unit is acquired by mean of the communication, the bill identification level is updated on the basis of the acquired bill identification level and of an identification result of a bill inserted into the bill processing unit, and the updated bill identification level is written to the flash memory.

20. The control method of the multi-ROM writer according to claim 11, wherein the target equipment includes at least one of a controller, a coin processing unit, a bill processing unit, and a card processing unit which are installed in an automatic vending machine.

* * * * *